United States Patent [19]

Ohno

[11] Patent Number: 4,764,452
[45] Date of Patent: Aug. 16, 1988

[54] PHOTOSENSITIVE RESIN COMPOSITIONS

[75] Inventor: Takao Ohno, Iruma, Japan

[73] Assignee: Tamura Kaken Co., Ltd., Saitama, Japan

[21] Appl. No.: 64,160

[22] Filed: Jun. 19, 1987

Related U.S. Application Data

[63] Continuation-in-part of Ser. No. 795,010, Nov. 4, 1985, abandoned.

[51] Int. Cl.$^4$ .............................................. G03C 1/68
[52] U.S. Cl. .................................... 430/288; 430/285; 430/286; 430/910; 522/121; 522/122
[58] Field of Search ............... 430/285, 286, 288, 910; 522/121, 122

[56] References Cited

U.S. PATENT DOCUMENTS 4,370,403  1/1983  Takaki .............................. 430/271

Primary Examiner—Joseph L. Schofer
Assistant Examiner—Peter D. Mulcahz
Attorney, Agent, or Firm—Fulbright & Jaworski

[57] ABSTRACT

The present invention provides a photosensitive resin composition comprising (a) 10–60 wt. % of a styrene—maleic acid copolymer or its partially esterified product having a molecular weight of 1,000–3,000 and an acid value of 50–500, (b) 1–30 wt. % of acrylate or methacrylate having a tetrahydrofurfuryl group or a hydroxyl group, (c) 1–30 wt. % of diacrylate or dimethacrylate of polyethyleneglycol or polypropylene glycol, (d) 1–40 wt. % of a monoester compound represented by the following general formula (I), (II), (III), (IV) or (V).

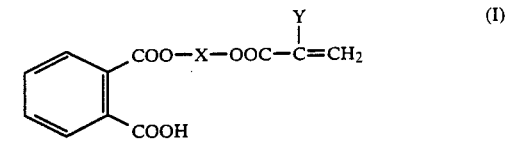

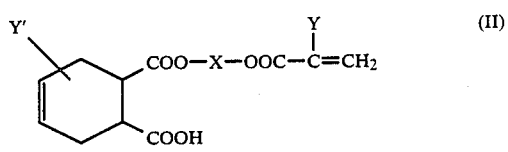

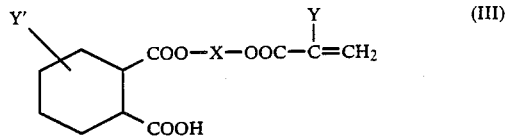

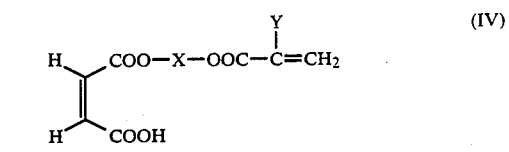

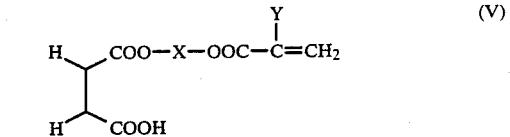

(wherein, X stands for a divalent organic group, preferably an alkylene group having carbon atoms of 1–4 or $-C_nH_{2n}O-_pCH_2$ group wherein n is an integer of 2–6 and p is an integer of 1–19; Y stands for hydrogen atoms or a methyl group; and Y' stands for hydrogen atoms or an alkyl group having carbon atoms of 1–4.).

10 Claims, No Drawings

PHOTOSENSITIVE RESIN COMPOSITIONS

CROSS-REFERENCE TO RELATED APPLICATION

The present application is a continuation-in-part application of copending patent application Ser. No. 06/795,010, filed Nov. 4, 1985, now abandoned, entitled "Photosensitive Resin Compositions."

BACKGROUND OF THE INVENTION (a) Field of the Invention

The present invention relates to a photosensitive resin composition for use in the preparation of a printed-wiring board, and more specifically, to a solventless liquid photosensitive resin composition that can be developed and stripped off using an aqueous alkali solution.

(b) Description of the Prior Art

A printed-wiring board is normally prepared by forming a photosensitive layer on a base board. This is typically done in one of two ways. According to the first method, a solvent-containing photosensitive composition, i.e., a photoresist, is coated on the copper surface of a copper-foil laminate (hereinafter referred to as a base board for printed circuits) and thereafter dried to thereby form a photosensitive coated film. Alternatively, the board can be prepared by applying, i.e., laminating, a dry film (that comprises applying a dry photoresist film, as a photosensitive film, between a cover film made of polyethylene or the like and a base film made of polyester or the like. In this case, the cover film is stripped off, and the exposed photosensitive film together with the base film are adhered to the copper surface. Once the photosensitive film is present on the board, according to either method of application, a negative film having a desired circuit pattern is contacted with the film (in the case of the dry film, it is contacted with the surface of the base film). The film is then exposed under vacuum to thereby cure the coated film or dry film on the exposed portion. Thereafter, the noncured coated film or dry film is removed by means of a developer, for instance an aqueous solution of alkali such as sodium carbonate. The thus exposed copper portion is then etched and removed by means of an etching liquid that is normally comprised of an aqueous solution of ferric chloride or cupric chloride. The remaining coated film or dry film, namely the protective film, is then stripped off by means of a stripping liquid, for instance an aqueous solution of alkali such as sodium hydroxide.

The photoresist or dry film may alternatively be used as a plating resist. In this instance, the steps prior to the developing treatment are carried out in the same manner as described above to thereby form a pattern. The exposed copper portion is subjected to copper sulfate plating, soldering or the like, and the plating resist is then stripped off. Thereafter, etching is effected.

Accordingly, the photoresist and dry film for use in the printed-wiring board prepared using the above-mentioned photoengraving technique advantageously should have superior performance characteristics, such as coating ability (laminating ability in the case of the dry film), uniformity of the coated film, curing (sensitivity) and developing ability, further adhesion and hardness of the cured coated film, stripping ability of the cured coated film, resistance to etching liquids and various platings, and the like. However, use of the above photoresist has encountered various problems which need to be solved. For example, because the photoresist is of a solvent type which requires dissolving a photosensitive material in a solvent, it necessitates a drying step to volatilize the used solvent after a coated film has been formed, thereby making the continuity of production line worse. Additionally, because the photoresist contains the solvent, the viscosity of the photoresist is apt to change when coating, thereby making the control of film thickness and the formation of uniform coated films difficult. Also, the organic solvent contained in the photoresist exerts a bad influence upon the human body, and so must be placed under control.

In view of this, there has recently been observed a growing tendency to replace the photoresist with the dry film. However, the dry film is defective in that it is expensive and further makes the continuity of production line worse in comparison to that of the photoresist because it needs a holding time of about 15 minutes in order to stabilize a coated film after lamination and exposure have been completed. For these reasons, there has recently been proposed a process of using a solventless liquid photoresist. This process comprises coating the liquid photoresist on the copper surface of a base board, then placing a negative film in an off-contact state directly on the resulting coated film without a drying or holding step, and then radiating parallel light thereon.

As an example of a solventless liquid photoresist used in this process, U.S. Pat. No. 4,436,806 (Japanese Laid Open Patent Application No. 164595/1982) describes a photoresist consisting essentially of a polyene-thiol compound. However, this solventless liquid photoresist is not preferable because it requires complicated steps for manufacturing the printed-wiring board, such as preliminary UV curing to exposure, UV post-curing after development, and the like. In addition, the known photoresist smells bad because it contains thiol and the like. Furthermore, when it is used as plating resist, a chelate compound is formed by reaction of copper with thiol to thereby make plating adhesion worse. In any case, the fact is that there has hitherto been unknown a solventless liquid photoresist which can concurrently satisfy the performances required for the printed-wiring board, namely (1) the rate of polymerization at the time of exposure, which is related to the curing ability of coated films, (2) the viscosity and leveling ability of liquid, which properties are related to the coating ability, and uniformity and developing ability of coated films, (3) the hardness, adhesion and stripping ability of cured films, and resistance to etching liquid and various plating liquids, and further (4) superior adhesion of plating to the exposed copper portion.

SUMMARY OF THE INVENTION

The primary object of the present invention is to provide a solventless liquid photosensitive resin composition that is high in the rate of polymerization upon exposure, is low in the liquid viscosity, is superior in the leveling ability, is capable of forming uniform coated films and cured films of high hardness, can develop or strip off the coated films or cured films readily by means of an aqueous alkali solution, is resistant to various platings and the like, and has an improved adhesion of plating to the exposed copper portion.

The secondary object of the present invention is to provide a photosensitive resin composition that is of a solventless type, thereby dispensing with the drying and holding steps, and which can expedite the continuity of production line.

The photosensitive resin composition according to the present invention is characterized by containing, as the principal components, (a) 10–60 wt.% of a styrene—maleic acid copolymer or its partially-esterified product having a molecular weight of 1,000–30,000 and an acid value of 50–500, (b) 1–30 wt.% of acrylate or methacrylate having a tetrahydrofurfuryl group or a hydroxyl group, (c) 1–30 wt.% of a diacrylate or dimethacrylate of polyethylene glycol or polypropylene glycol, (d) 1–40 wt.% of a monoester compound obtained by the reaction of an acid anhydride or a dibasic acid derived therefrom with an acrylate or methacrylate having a hydroxyl group and (e) 0.5–10 wt.% of a photosensitizer.

DETAILED DESCRIPTION OF THE PREFERRED EMBODIMENTS

In the photosensitive resin composition according to the present invention, the resin component (a) constitutes the base of the composition. Its molecular weight is 1,000–30,000, preferably 1,000–5,000, and its acid value is 50–500, preferably 100–300. In case the molecular weight is less than 1,000, the surface curing ability of the coated film deteriorates under the influence of oxygen in the air, while in case the molecular weight is over 30,000, the photosensitivity of the composition (liquid photoresist) is improved, but the liquid viscosity is elevated, thereby making uniform coating difficult. Referring to the acid value, in case it is less than 50, the alkali-developing ability or alkali-stripping ability of coated films or cured films deteriorates, while in case it is over 500, the hardness of coated films decreases and the resistance to etchants deteriorates. In any case, this resin component is used in the range of 10–60%. In case it is used in an amount of less than 10%, the hardness of coated films decreases, while in case it is used in an amount of over 60%, the liquid viscosity is raised to thereby make uniform coating difficult.

Examples of the above-mentioned component (a) are marketed by Arco Chemical Co. under the trademarks, such as SMA-1000, SMA-2000, SMA-3000, SMA-1440A, SMA-17352, SMA-2625 and SMA-3840.

Next, components (b), (c) and (d) are photopolymerizable monomers having vinyl type double bonds, and are present in the composition in the ratios of 1–30%, 1–30% and 1–40%, respectively. Component (b) mainly contributes to the decrease of liquid visocity and the increase of hardness of cured films. However, in case component (b) is less than 1%, these effects cannot be displayed, while in case this component is over 30%, the hardness of cured films deteriorates. Component (c) mainly contributes to the improvement of photosensitivity. However, in case component (c) is less than 1%, this effect cannot be displayed, while in case this component is over 30%, the hardness of cured films deteriorates. Component (d) mainly contributes to the improvement of alkali-developing ability or alkali-stripping ability. However, in case component (d) is less than 1%, these effects cannot be displayed, while it is not preferable that this component be over 40% because cured films swell at the time of developing.

As concrete examples of component (b), there can be enumerated tetrahydrofurfuryl acrylate, tetrahydrofurfurylmethacrylate, 2-hydroxyethyl acrylate, 2-hydroxypropyl acrylate, 2-hydroxyethyl methacrylate, 2-hydroxypropyl methacrylate and the like.

As the propylene glycol or polypropylene glycol portion in component (c), there is preferably used one whose molecular weight is in the range of 200–2,000.

As component (d) there can be enumerated a monoester compound represented by the following general formula (I), (II) (III), (IV) or (V).

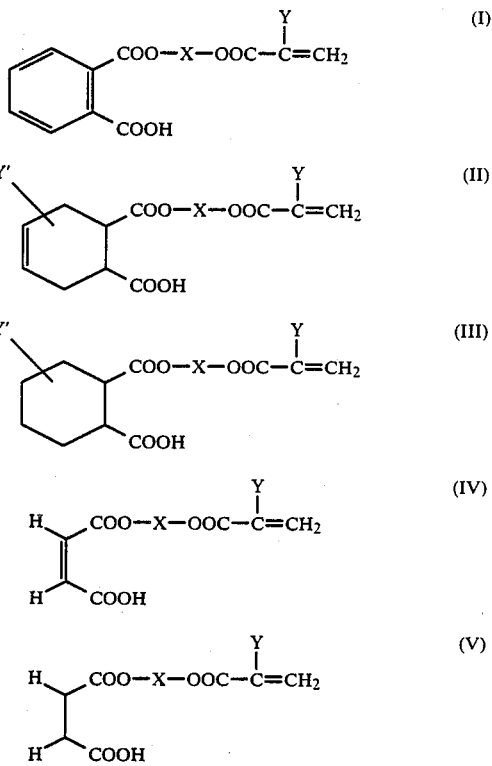

(wherein, X stands for a divalent organic group, preferably an alkylene group having carbon atoms of 1–4 or $-(C_nH_{2n}O)_p-CH_2$ group wherein n is an integer of 2–6 and p is an integer of 1–9; Y stands for hadrogen atoms or a methyl group; and Y' stands for hydrogen atoms or an alkyl group having carbon atoms of 1–4.)

These monoester compounds are preferably synthesized by ring-opening addition reaction between an acid anhydride and an acrylate or methacrylate having a hydroxyl group, but may be synthesized through a conventional esterification reaction between the dibasic acid derived from said acid anhydride and said acrylate or methacrylate. In said ring-opening addition reaction, the reaction temperature is 30° C.–160° C., reaction accelerators such as triethylamine, benzyldimethylamine and the like may be used, and polymerization inhibitors such as hydroquinone, phenothiazine and the like may be used in order to inhibit the occurence of polymerization during the progress of reaction. The thus obtained monoester compound may be used singly or as a mixture of two kinds or more.

As concrete examples of the dibasic acid or its anhydride used herein, there can be enumerated phthalic acid, tetrahydrophthalic acid, 3-methyltetrahydrophthalic acid, 4-methyltetrahydrophthalic acid, 3-ethyltetrahydrophthalic acid, 4-ethyltetrahydrophthalic acid, 3-propyltetrahydrophthalic acid, 4-propyltetrahydrophthalic acid, 3-butyltetrahydrophthalic acid 4-butyltetrahydrophthalic acid, hexahydrophthalic acid, 3-methylhexahydrophthalic acid, 4-methylhexahydrophthalic acid, 3-ethylhexahydrophthalic acid, 4-ethylhexahydrophthalic acid, 3-propylhexahydrophthalic acid, 4-propylhexahydrophthalic acid, 3-butylhexahydrophthalic acid, 4-butylhexahydrophthalic acid, maleic acid, succinic acid and anhydrides thereof, and the like. While, as concrete examples of the acrylate or methacrylate having a hydroxyl group, there can be enumerated 2-hydroxyethyl(meta) acrylate, 2-hydroxypropyl(meta) acrylate, 2-hydroxybutyl(meta) acrylate, polyethylene glycol mono(meta) acrylate, polypropylopyrene glycol mono(meta) acrylate, polybutylene glycol mono(meta) acrylate, polycaprolactone mono(meta) acrylate and the like.

The photosensitizer (e) is present in the percentage of 0.5–10, preferably 1–5. In case the percentage is less than 0.5, no photosensitizing effect is displayed, while in case the percentage is over 10, a significantly greater effect cannot be obtained, and therefore, is generally unprofitable from the point of cost.

As the photosensitizer there may be used any conventional one, for example, α-carbonyl alcohols such as benzoin, butyroin, trioin, acetoin, α-methylbenzoin, α-phenylbenzoin, α-allylbenzoin, α-benzylbenzoin and the like; benzoinalkyl ethers such as benzoinmethyl ether, benzoinisopropyl ether and the like; polynuclear quinones such as anthraquinone, 2-methylanthraquinone, 2-ethylanthraquinone, 2-t-butylanthraquinone, 2-nitroanthraquinone, anthraquinone-1-aldehyde, anthraquinone-2-thiol, 1-chloroanthraquinone and the like.

The photosensitive resin composition according to the present invention may include polymerizable monomers other than components (b), (c) and (d), a storage stabilizer for preventing thermal polymerization, a coloring agent, an adhesion donator and concurrently a chemical resistance improver, a levelling agent for obtaining a superior coating ability, an antifoaming agent, body extender pigments and the like.

These other polymerizable monomers include acrylic acid, butyl acrylate, dimethylaminoethyl acrylate, glycidyl methacrylate, 1,6-heranediol diacrylate, trimethylolpropane triacrylate, pentaerythritol triacrylate, pentaerythritol tetracrylate, neopentylglycol methacrylate, dipentaerythritol hexaacrylate, triethylene glycol diacrylate, pentaerythritol triacrylate and the like.

As the storage stabilizer there can be enumerated p-methoxyphenol, hydroquinone, phenothiazine, naphthylamine, cuprous chloride, Al salt of N-nitrosophenylhydroxylamine and the like.

The preferable coloring agents are those which do not affect the photosensitivity of the composition such as, for instance, Fuchsine, Crystal Violet, Victoria Blue, leuco dye, phthalocyanine and the like.

As the adhesion donator and concurrently the chemical resistance improver there are enumerated benzotriazole, melamine, imidazole, mercaptobenzothiazole, mercaptobenzoimidazole, 2,4,6-trimercapto-S-triazine, trismercaptopropyl isocyanurate and the like.

As the body extender pigments, there can be enumerated finely divided silica, talc, barium sulphate, bentonite and the like.

The leveling agents include acrylic copolymers which are commercially available under the trademarks such as MODAFLOW (produced by Monsanto Co.), PERENOL F$_3$ (produced by Henkel Co.), RESIMIX (produced by Mitsui Toatsu Kagaku K.K.) and the like.

As the antifoaming agents there can be enumerated methylsilicon polydimethylsiloxane oil or its modified ones or the like. As the commercially available antifoaming agents there can be enumerated methylsilcone oil, polydimethylsiloxane oil, silicone oil or modified products thereof and the like.

As the goods on the market there can be enumerated TSA-750 produced by Toshiba Silicone K.K., KS-66 produced by Sinetu Kagaku Kogyo K.K. and the like.

The photosensitive resin composition according to the present invention may be compounded with alkali-soluble resins such as, for instance, methacrylic acid—methylmethacrylic acid copolymer, butadiene—maleic anhydride copolymer, phenol resin and the like, in a range that is not opposed to the objects of the present invention.

The photosensitive resin composition according to the present invention that comprises the above mentioned components is of a solventless type, and therefore can expose a base board for printed circuits as-coated directly without holding and drying steps. Further, this composition, which has a low viscosity of 10–100 PS, in particular 10–40 PS, in spite of being solventless, can effect coating by means of bar coating, roll coating, dipping, curtain coating, spraying, jetting, foam-coating. Furthermore, this composition, which is of a low viscosity and superior in leveling ability, can obtain a uniformly coated film free from coating unevenness, pinholes and the like. Still furthermore, this composition can be cured with an energy level of 20–100 mJ/cm$^2$ even in the air, and so can operate under at least equivalent exposure times as compared with the conventional solvent type photo-resist, dry film and the like which carry out exposure while cutting off the air (under vacuum). This composition can reduce the exposure time by about $\frac{1}{2}$–1/5 of that in the air, in the manner of carrying out exposure in the atmosphere of nitrogen, carbon dioxide gas and the like. The photosensitive resin composition or its cured product according to the present invention also can be developed or stripped off by means of an aqueous alkali solution. As the alkali used herein there can be enumerated sodium metasilicate, sodium hydroxide, potassium hydroxide, sodium carbonate and the like. This aqueous alkali solution may be added with water soluble solvents such as ethyl cellosolve, butyl cellosolve ethanol, dioxane and the like; and an anion or nonion surface active agent in order to improve the permeability of the developer or stripping liquid as occasion demands.

The present invention will be explained in more detail with reference to the Examples below. Parts are all parts by weight.

EXAMPLE 1

| | |
|---|---|
| Partially-esterified styrene - maleic acid copolymer (SMA-1440A, molecular weight: 2500 and acid value: 175) | 30 parts |
| Tetrahydrofurfuryl acrylate | 6 parts |
| 2-hydroxylethyl acrylate | 5 parts |
| 2-hydroxylethyl acrylate monoester of phthalic acid | 30 parts |
| Diacrylate of polyethylene glycol (molecular weight: 200) | 10 parts |
| Trimethylol propane triacrylate | 15 parts |
| Acrylic type copolymer (Modaflow) | 1 part |
| 2-ethyl anthraquinone | 2 parts |
| Victoria Blue | 1 part |
| Al salt of nitrosophenyl hydroxylamine | 0.02 part |

The above components were mixed to obtain a uniform liquid photosensitive resin composition. Its viscosity was 40 PS (at 25° C., which is applicable hereinafter). Next, this composition was coated on the copper surface of a base board for printed circuits by means of a roll coater to form a 35 μm-thick photosensitive coated film. A negative film was applied from above for 7 seconds by means of a high tension mercury short arc lamp (output: 5 kw) for curing the coated film on the exposed portion. Next, this coated film surface was developed by spraying thereon a 1% aqueous sodium carbonate solution (30° C.) for 20 seconds, washed and dried. The resulting protective film was observed to have a high pencil hardness of 3H and display a sufficient resistance to the normal etchants comprising ferric chloride or cupric chloride, soldering, copper, sulfate plating and the like. Furthermore, it was found that when this base board was dipped in a 3% aqueous sodium hydroxide solution (60° C.), the protective film had been stripped off completely in 15 seconds.

Comparative Example 1

A liquid photosensitive resin composition was prepared by the same procedure as Example 1 except that SMA-1440A was changed from 30 parts to 43.5 parts, tetrahydrofurfuryl acrylate was changed from 6 parts to 8.5 parts, 2-hydroxyethyl acrylate was changed from 5 parts to 7.5 parts, diacrylate of polyethylene glycol was changed from 10 parts to 14.5 parts, trimethyol propane triacrylate was changed from 15 parts to 22 parts, and 2-hydroxyethyl acrylate monoester of phthalic acid was excluded. Its viscosity was 50 PS. Then, a photosensitive coated film was formed on a base board using this composition according to the same procedure as Example 1, and then same was exposed and developed to find that development was insufficient and under-development was caused. Due to this, development was carried out by extending the developing time to 60 seconds equivalent to three times that in Example 1. Then, this board was washed and dried to obtain a protective film. This cured film was observed to have a high pencil hardness of 3H and to be sufficient in the point of resistance to etchants and plating, but to be very slow in stripping (three minutes).

EXAMPLE 2

| | |
|---|---|
| SMA-1440A | 43 parts |
| 2-hydroxyethyl acrylate | 15 parts |
| Diacrylate of polyethylene glycol (molecular weight: 600) | 4 parts |
| Diacrylate of polyethylene glycol (molecular weight: 200) | 4 parts |
| 2-hydroxyethyl acrylate monoester of maleic acid | 10 parts |
| Trimethylol propane triacrylate | 20 parts |
| Benzophenone | 1.5 parts |
| 2-ethylaminobenzophenone | 1.5 parts |
| Melamine | 0.4 part |
| Silicone oil (KS-66) | 0.02 part |
| Leuco dye | 1 part |
| Hydroquinone | 0.01 part |

The above components were mixed to obtain a uniform liquid photosensitive resin composition. Its viscosity was 50 PS. Next, this composition was coated on the copper surface of a base board by means of a roll coater to form a 35 μm-thick photosensitive coated film. A negative film was placed at a distance of 0.5 mm from this coated film, and same was exposed from above for 7 seconds by means of a high tension mercury short arc lamp (output: 5 kw) for curing the coated film on the exposed portion. Next, this coated film surface was developed by spraying thereon a 1% aqueous sodium silicate solution (30° C.) for 15 seconds, washed and dried. The hardness and resistance to etchants and plating of the thus obtained protective film were exactly the same as Example 1. Further, it was found that when this film was dipped in a 3% aqueous sodium hydroxide solution (60° C.), the film had been stripped off completely in 23 seconds.

Comparative Example 2

A liquid photosensitive resin composition was prepared according to the same procedure as Example 2 except that hydroxyethyl acrylate was changed from 15 parts to 18 parts, 2-hydroxyethyl acrylate monoester of maleic acid was changed from 10 parts to 12 parts and trimethylol propane triacrylate was changed from 20 parts to 23 parts, respectively, and the two polyethylene glycol diacrylates were excluded. Its viscosity was 60 PS. Then, a photosensitive coated film was formed thereon using this composition according to the same procedure as Example 2. The film was exposed and thereafter developed by spraying a 1% aqueous sodium silicate solution (30° C.) for 30 seconds, washed and dried to find that the thus obtained protective film partly swelled, and consequently an etchant and a plating liquid soaked into the swollen portion, whereby a sufficient resistance could not be displayed.

EXAMPLE 3

| | |
|---|---|
| Styrene-maleic acid copolymer (SMA-1000, molecular weight: 1,600 and acid value: 480) | 15 parts |
| Methyl methacrylate-methacrylic acid copolymer | 10 parts |
| 2-hydroxyethyl methacrylate | 15 parts |
| Tetrahydrofurfuryl methacrylate | 10 parts |
| Diacrylate of polyethylene glycol (molecular weight: 1,000) | 5 parts |
| 2-hydroxypropyl methacrylate monoester of succinic acid | 15 parts |
| Tetraethylene glycol diacrylate | 15 parts |
| Pentaerythritol tetraacrylate | 10 parts |
| Amyl anthraquinone | 5 parts |
| Benzotriazole | 0.1 part |
| Methyl Violet | 0.3 part |
| RESIMIX | 1 part |

The above components were mixed to obtain a liquid photosensitive resin composition. Its viscosity was 45 PS. Next, this composition was coated on the copper surface of a base board by means of a roll coater to form a 30 μm-thick photosensitive coated film. Next, a negative film was placed at a distance of 2 mm from this coated film, and same was exposed from above for 10 seconds by means of a high tension mercury arc lamp (output: 5 kw) for curing the coated film on the exposed portion. Then this coated film surface was developed by spraying thereon an aqueous sodium bicarbonate solution (30° C.) for 15 seconds, and thereafter washed and dried. The resistance to etchants and plating of the thus obtained protective film was exactly the same as Example 1. This film was found to have a high hardness (pencil hardness) of 2H. Further, it was found that when this coated film was dipped in a 3% aqueous sodium hydroxide solution (60° C.), said film had been stripped off completely in 25 seconds.

Comparative Example 3

A liquid photosensitive resin composition was prepared according to exactly the same procedure as Example 3, except that 2-hydroxyethyl methacrylate and tetrahydrofurfuryl methacrylate were excluded, polyethylene glycol diacrylate was changed from 5 parts to 8 parts, 2-hydroxypropyl methacrylate of succinic acid was changed from 15 parts to 23 parts tetraethylene glycol diacrylate was changed from 15 parts to 23 parts, and pentaerythritol tetraacrylate was changed from 10 parts to 16 parts. This composition was found to have a high viscosity of 200 PS. This composition was coated on the copper surface of a base board by means of roll coater, but a uniform coated film could not be obtained due to this high viscosity. In view of this, this composition was coated by means of a screen printer to form a 25 μm-thick photosensitive coated film. Then the coated film surface was exposed for developing in the same manner as Example 3, and thereafter washed and dried. The obtained protective film was found to have a high pencil hardness of 3H, and displayed a sufficient resistance to etchants and plating. However, it was found that in case this film was dipped in a 3% aqueous sodium hydroxide solution (60° C.) for stripping, it barely peeled in 7 minutes and was not intended for practical purposes.

The present invention, therefore, is well adapted to carry out the objects and attain the ends and advantages mentioned, as well as others inherent therein. While presently preferred embodiments of the invention have been described for purposes of disclosure, numerous modifications will be readily apparent to those skilled in the art and which are encompassed within the spirit of the invention and the scope of the appended claims.

What is claimed is:

1. A photosensitive resin composition, comprising:
   (a) 10–60 wt.% of styrene—maleic acid copolymer or its partially esterified product having a molecular weight of 1,000–30,000 and an acid value of 50–500;
   (b) 1–30 wt.% of acrylate or methacrylate having a tetrahydrofurfuryl group or a hydroxyl group;
   (c) 1–30 wt.% of diacrylate or dimethacrylate of polyethylene glycol or polypropylene glycol;
   (d) 1–40 wt.% of a compound represented by the following general formula (I), (II), (III), (IV) or (V):

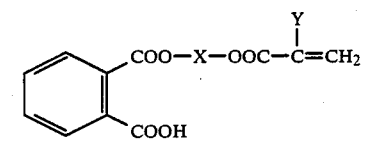

(I)

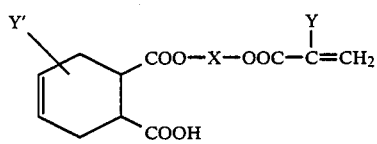

(II)

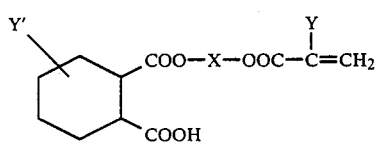

(III)

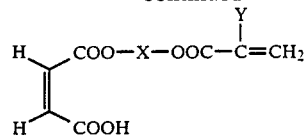

(IV)

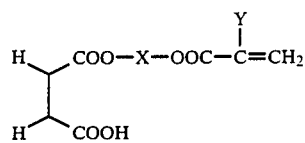

(V)

wherein, X stands for a divalent organic group; Y stands for hydrogen atoms or a methyl group; and Y' stands for hydrogen atoms or an alkyl group having carbon atoms of 1–4; and
   (e) 0.5–10 wt.% of a photosensitizer.

2. A composition according to claim 1, wherein component (a) has a molecular weight of 1,000–5,000 and an acid value of 100–300.

3. A composition according to claim 1, wherein component (c) has a molecular weight of 200–2,000.

4. A composition according to claim 1, wherein the component (d) is obtained by the reaction of an acid anhydride or a dibasic acid derived therefrom with an acrylate or methacrylate having a hydroxyl group, said dibasic acid being selected from the group consisting of phthalic acid, tetrahydrophthalic acid, 3-methyltetrahydrophthalic acid, 4-methyltetrahydrophthalic acid, 3-ethyltetrahydrophthalic acid, 4-ethyltetrahydrophthalic acid, 3-propyltetrahydrophthalic acid, 4-propyltetrahydrophthalic acid, 3-butyltetrahydrophthalic acid, 4-butyltetrahydrophthalic acid, hexahydrophthalic acid, 3-methylhexahydrophthalic acid, 4-methylhexahydrophthalic acid, 3-ethylhexahydrophthalic acid, 4-ethylhexahydrophthalic acid, 3-propylhexahydrophathalic acid, 4-propylhexahydrophthalic acid, 3-butylhexahydrophthalic acid, 4-butylhexahydrophthalic acid, maleic acid and succinic acid, said acrylate or methacrylate being selected from the group consisting of 2-hydroxyethyl(meta) acrylate, 2-hydroxypropyl(meta) acrylate, 2-hydroxybutyl(meta) acrylate, polyethylene glycol mono(meta) acrylate, polypropylopyrene glycol mono(meta) acrylate, polybutylene glycol mono(meta) acrylate and polycaprolactone mono(meta) acrylate.

5. A composition according to claim 4, wherein the dibasic acid is selected from the group consisting of phthalic acid, tetrahydrophthalic acid, 3-methyltetrahydrophthalic acid, maleic acid and succinic acid.

6. A composition according to claim 1, wherein component (d) is 2-hydroxyethyl(meta) acrylate monoester of phthalic acid.

7. A composition according to claim 1, wherein component (d) is 2-hydroxyethyl acrylate monoester of maleic acid.

8. A composition according to claim 1, wherein component (d) is 2-hydroxypropyl(meta) acrylate of succinic acid.

9. A plating resist or an etching resist used as a protective film in the preparation of a printed board which is comprised of the composition of claim 1.

10. The resist of claim 9, wherein the composition can be readily removed from the board by an aqueous alkali solution after plating and etching treatments have been conducted.

* * * * *

UNITED STATES PATENT OFFICE
CERTIFICATE OF CORRECTION

Patent No. 4,764,452  Dated August 16, 1988

Inventor(s) Takao Ohno

It is certified that error appears in the above-identified patent and that said Letters Patent are hereby corrected as shown below:

IN THE ABSTRACT

Column 2, third line below formula V, kindly delete "$-C_nH_{2n}O-_pCH_2$" and insert instead --$(-C_nH_{2n}O-)_pCH_2$--.

IN THE SPECIFICATION

Column 3, line 49, kindly delete "visocity" and insert instead --viscosity--.

Column 4, line 1, kindly delete "propylene" and insert instead --polyethylene--.

Column 4, line 41, kindly delete "9" and insert instead --19--.

Column 4, line 66, after "acid" (second occurrence), kindly insert a comma --,--.

Column 6, line 2, kindly delete "methysilcone" and insert instead --methylsilicone--.

Signed and Sealed this

Seventeenth Day of January, 1989

*Attest:*

DONALD J. QUIGG

*Attesting Officer*   *Commissioner of Patents and Trademarks*